United States Patent
Li et al.

(10) Patent No.: US 12,525,872 B2
(45) Date of Patent: Jan. 13, 2026

(54) METHOD AND APPARATUS FOR SWITCHING-MODE POWER SUPPLY STARTUP

(71) Applicant: Avago Technologies International Sales Pte. Limited, Singapore (SG)

(72) Inventors: Shengyuan Li, Irvine, CA (US); Leon Samuel Wang, Irvine, CA (US); I-Ning Ku, Irvine, CA (US); Xicheng Jiang, Irvine, CA (US)

(73) Assignee: Avago Technologies International Sales Pte. Limited, Singapore (SG)

( * ) Notice: Subject to any disclaimer, the term of this patent is extended or adjusted under 35 U.S.C. 154(b) by 303 days.

(21) Appl. No.: 18/128,972

(22) Filed: Mar. 30, 2023

(65) Prior Publication Data

US 2024/0333139 A1    Oct. 3, 2024

(51) Int. Cl.
*H02M 1/36* (2007.01)
*H02M 1/32* (2007.01)
*H03K 7/08* (2006.01)

(52) U.S. Cl.
CPC ............... *H02M 1/36* (2013.01); *H02M 1/32* (2013.01); *H03K 7/08* (2013.01)

(58) Field of Classification Search
CPC ........ H02M 1/36; H02M 1/32; H02M 1/0038; H02M 1/08; H03K 7/08; H02H 9/001; H02H 9/002
See application file for complete search history.

(56) References Cited

U.S. PATENT DOCUMENTS

| | | | |
|---|---|---|---|
| 2012/0091978 A1* | 4/2012 | Ishii | H02M 1/36 323/271 |
| 2016/0218613 A1* | 7/2016 | Hussien | H02M 1/36 |
| 2018/0212517 A1* | 7/2018 | Kuwano | H02M 1/36 |
| 2023/0387801 A1* | 11/2023 | Govindarajulu | H02M 1/36 |

FOREIGN PATENT DOCUMENTS

| | | |
|---|---|---|
| CN | 114051689 A | 2/2022 |
| EP | 2 424 090 A2 | 2/2012 |
| WO | WO-2018/227422 A1 | 12/2018 |

OTHER PUBLICATIONS

European Search Report on non-Foley case related to US Dtd Aug. 27, 2024.

* cited by examiner

*Primary Examiner* — Jue Zhang
*Assistant Examiner* — Jye-June Lee
(74) *Attorney, Agent, or Firm* — Foley & Lardner LLP (57) ABSTRACT

An apparatus includes a circuitry to perform a first startup stage and to vary, during a second startup stage subsequent to the first startup stage, a duty cycle of a pulse controlling one or more switches of the circuitry.

19 Claims, 7 Drawing Sheets

METHOD AND APPARATUS FOR SWITCHING-MODE POWER SUPPLY STARTUP

TECHNICAL FIELD

The present description relates generally to electronic circuits including, for example, a method and apparatus for switching-mode power supply startup.

BACKGROUND

A switching-mode power supply (SMPS) switches on a power stage to charge an inductor during a duty cycle time set by a pulse width modulator. The stored energy in the inductor will then be transferred to output by switching off the power stage during the rest of this switching cycle. This kind of switching behavior makes SMPS's startup current a triangular shape instead of a direct current (DC) as in the linear regulators, which suggests that the SMPS's input current would have a high crest factor.

In battery-powered devices such as health sense wearable devices, power is distributed through the power distribution network (PDN) to many function blocks such as a power-management unit (PMU), one or more radiofrequency (RF) block(s), one or more processor(s), memory and so on. Too high values of peak inrush current from any block may result in voltage sag/dip that can potentially trigger the power-on reset (POR) to shut down the system. Therefore, the inrush current specification is a design parameter for SMPS. Another related parameter is a startup time. As the system becomes more complicated with more functions integrated, maintaining the quick startup will improve the user experience.

BRIEF DESCRIPTION OF THE DRAWINGS

Certain features of the subject technology are set forth in the appended claims. However, for purposes of explanation, several aspects of the subject technology are depicted in the following figures.

DETAILED DESCRIPTION

The detailed description set forth below is intended as a description of various configurations of the subject technology and is not intended to represent the only configurations in which the subject technology may be practiced. The appended drawings are incorporated herein and constitute a part of the detailed description. The detailed description includes specific details for the purpose of providing a thorough understanding of the subject technology. However, the subject technology is not limited to the specific details set forth herein and may be practiced using one or more implementations. In one or more instances, structures and components are shown in block-diagram form in order to avoid obscuring the concepts of the subject technology.

According to some aspects, the subject technology is directed to a method and apparatus for SMPS startup in electronic devices, for example, in wearable devices such as health wearable devices. Specifically, the subject technology keeps the inrush current and the startup time under control in the multiple stages of the startup of the boost converter of the SMPS. In some aspects, the subject technology begins the first startup stage (buck stage) with charging a passive circuit including passive elements, then charging with a constant current with a closed-loop regulation, and finally turning an isolation switch of a boost converter of the SMPS fully on. In some embodiments, the constant-current charging refers to charging using a closed-loop regulation circuit that regulates the current (e.g., a load current) to keep the current constant.

Next, when the boost converter enters a second startup stage (boost stage), the disclosed technique causes a forced input pulse-width modulation (PWM) to start with a small duty cycle and ramps up to higher duty cycles to maintain charging speed of the boost inductor while keeping the inrush current level below a desired value (e.g., 100 milli-amp (mA)). The term "duty cycle" of a pulse can be used to specify the ratio of the pulse duration (in time) to a pulse period, which is inverse of the pulse frequency (e.g., switching frequency). Once the boost converter output voltage increases to above a preset value (e.g., 4.75 V), the boost stage completes and a smooth transition (e.g., without interruption) to the closed-loop regulation stage takes place, where there is no inrush current. The term "stage", in the context of the subject disclosure, can be an action or a step, which is part of a process. For example, the multiple stages of the startup of the boost converter are actions or steps to be performed to complete the process of starting up the boost converter. The ability of the subject technology to control the inrush current and the startup time makes it superior to the existing techniques, which do not have inrush current control and startup stage transition and therefore suffers from rough startup behaviors.

Figure 1:
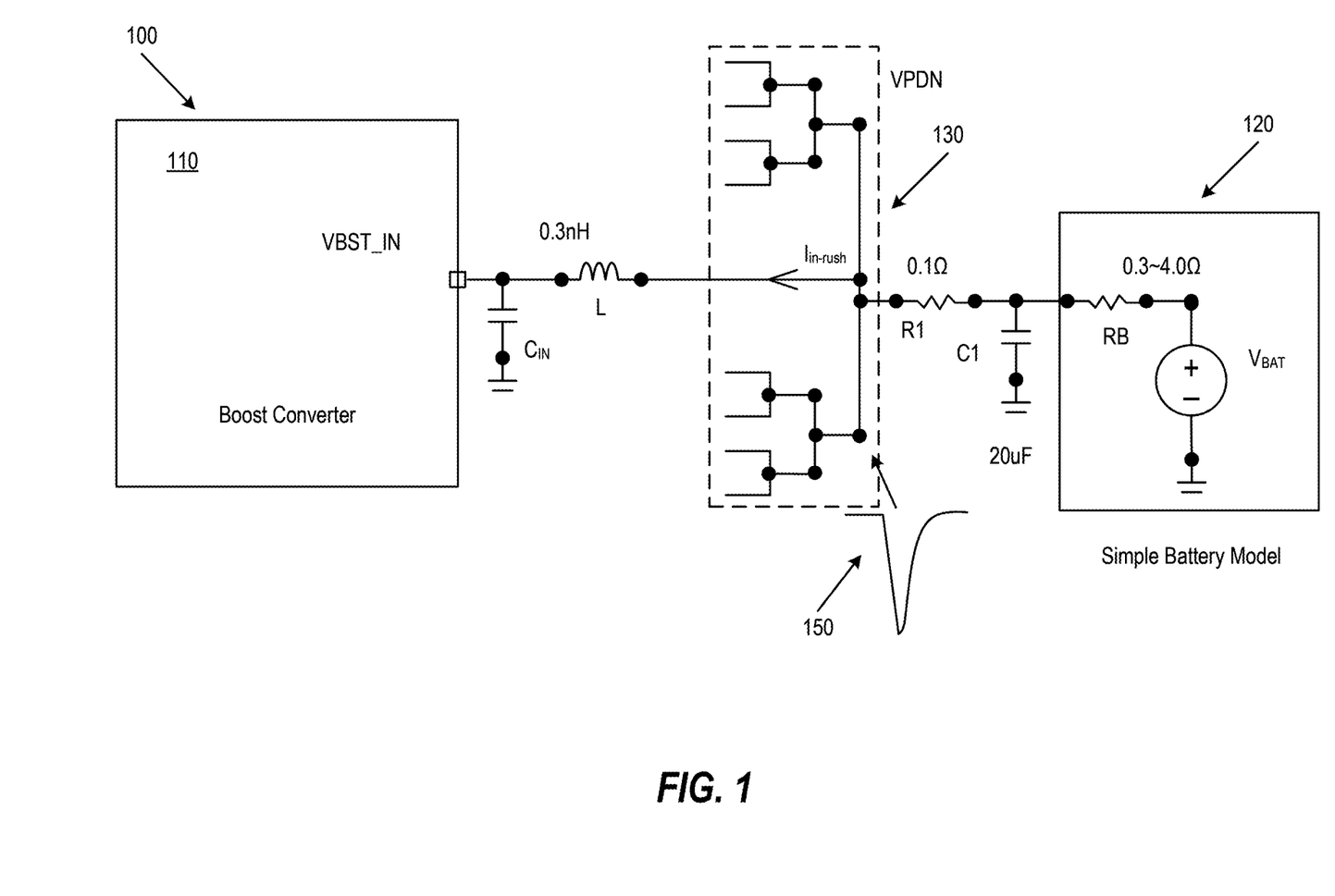
FIG. 1 is a high-level block diagram illustrating an example of an SMPS within which some aspects of the subject technology are implemented.

FIG. 1 is a high-level block diagram illustrating an example of an SMPS 100 within which some aspects of the subject technology are implemented. The SMPS 100 includes, but is not limited to, a boost converter 110 and a power source 120 coupled through a conductive routing to an input port VBST_IN of the boost converter 110. The conductive routing can be modeled via passive elements such as $C_{IN}$, L, R1 and C1, with example values as shown in FIG. 1. Also coupled to the power source 120 is a virtual PDN (VPDN) 130 for distribution of power to a number of functional blocks such as a PMU, one or more RF block(s), one or more processor(s), memory, and so on. In some embodiments, the power source 120 is a battery and can be modeled with a voltage source VBAT and an internal resistor RB (e.g., within a range of 0.3-4Ω). In some embodiments, the inrush current is the peak current that is drawn from the VPDN. In some embodiments, the startup time is the time between the instant that the boost converter 110 is enabled and the instant that the output power is ready, as discussed further herein.

In some embodiments, the boost converter 110 is used to provide an output voltage greater than the voltage of the power source 120 and includes circuitry to control a current and a time. In some embodiments, the current is an inrush current. In some embodiments, the time is a startup time. In some embodiments, the circuitry controls the inrush current and the startup time by performing a first startup stage in multiple phases (e.g., three phases), and varying, during a second startup stage, a duty cycle of a pulse controlling one or more switches of the boost converter. In some embodiments, varying the duty cycle is implemented by varying an on-time of the pulse while keeping the pulse period unchanged. In some embodiments, the circuitry includes passive elements to provide a path to charge an output port during a first phase of the multiple phases, as further discussed herein. In some embodiments, the circuitry also includes a closed-loop circuit configured to facilitate constant-current charging of an output port during a second phase of the multiple phases, as further discussed herein.

In some embodiments, the circuitry includes an isolation switch and a resistor circuit that turns on the isolation switch during a third phase of the multiple phases, as further discussed herein. In some embodiments, the circuitry includes a control circuit to vary the duty cycle of the pulse from a first value to a second value during the second startup stage, as further discussed herein.

In some embodiments, the first value of the duty cycle is within a range of 5% to 10% and the second value of the duty cycle is within a range of 50% to 60%. It should be noted that when the boost converter 110 enters a second startup stage (boost stage), the disclosed technique causes a forced input PWM to start with a small duty cycle and ramps up to higher duty cycles to maintain charging speed of the boost inductor while keeping the inrush current level below a desired value (e.g., 100 milliamp (mA)). In some embodiments, the circuitry controls the inrush current within a range of 90-110 mA. In some embodiments, the circuitry further includes a circuit that causes a smooth transition (e.g., without interruption) to a third startup stage with a near-zero inrush current. In some embodiments, the circuit comprises logic and a control block configured to provide an output voltage at an output port of the boost converter during the third startup stage, as further discussed herein. In some embodiments, the one or more switches of the boost converter include a second switch and a first switch configured to couple a switching node to an output port or a ground potential, respectively, as further discussed herein.

In some embodiments, the startup of the boost converter 110 involves three stages. In the first stage (first start-up stage), the output of the regulator is less than the input and there is a path from input to output. In some embodiments, the first stage is a buck stage. In the second stage, the output is greater than the input and switching has to be used to further boost the output. In some embodiments, the second stage is a boost stage. The third stage starts once the regulator output reaches the set point. In some embodiments, the third stage is closed-loop regulation stage, where a closed-loop feedback from the output of the regulator is used to regulate the output voltage of the regulator. Each stage of the startup is different, and it would be challenging to have both inrush current and startup time under control, as they are two contradictory parameters. The subject technology keeps the inrush current and startup time under control during the entire startup stages and provides a smooth transition in all of the three stages.

Figure 2A:
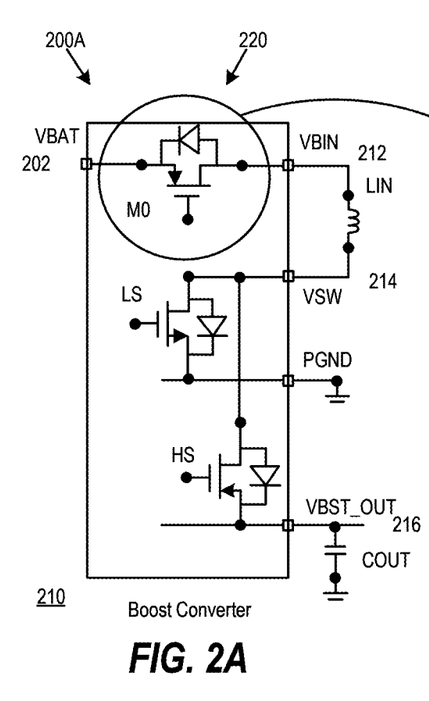
FIGS. 2A and 2B are schematic diagrams illustrating an example of a boost converter and a corresponding implementation, according to aspects of the subject technology.
Figure 2B:
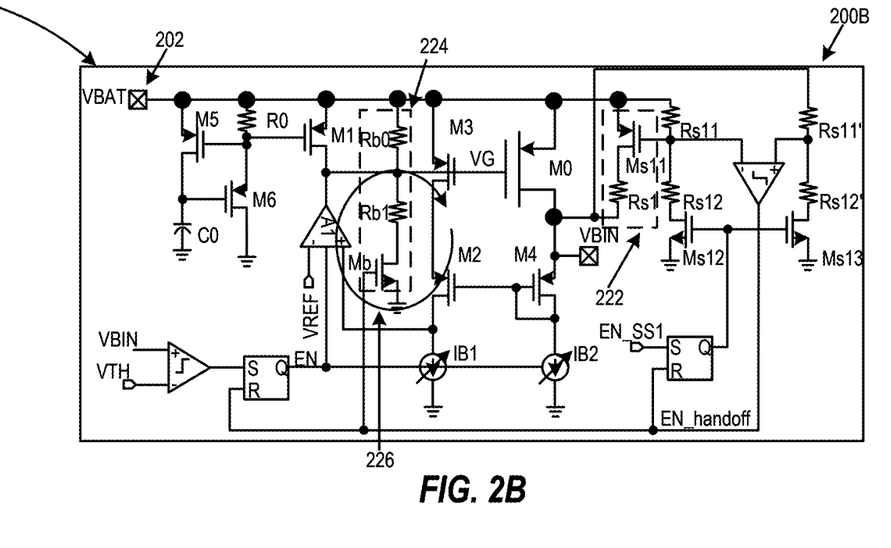

FIGS. 2A and 2B are schematic diagrams 200A and 200B, respectively, illustrating an example of a boost converter 210 and a corresponding implementation, according to aspects of the subject technology. In some embodiments, the boost converter 210 is an example high-level implementation of the boost converter 110 of FIG. 1. In some embodiments, the boost converter 210 includes, but is not limited to, an isolation switch 220, first switch (e.g., low-side (LS) switch), and a second switch (e.g., a high-side (HS) switch). The term "isolation" in the context of the isolation switch is used in reference to electrical isolation. For example, the isolation switch 220 is operable to electrically isolate the power source terminal 202 from an input port 212 of the boost converter 210, for example, when the switch is tuned off. The LS and HS switches are shown along with their respective internal diodes. In some embodiments, the HS switch and the LS switches couple a second terminal of the inductor LIN to the output port 216 or a ground potential (PGND), respectively. In some embodiments, the inductor LIN is a boost inductor, and the first terminal of the inductor LIN is connected to the input port 212, and the second terminal of the inductor LIN is connected to the switching node 214, which is also connected to drain terminals of the LS and HS switches. It should be noted that the LH and LS switches operate in an asynchronous way, that is when LH switch is on, the LS switch is off and vice versa. In some embodiments, the inductor LIN is referred to as a "boost inductor" because the inductor LIN is charged through the LS switch (when on) and subsequently discharged through the switch HS (when on), and the discharging causes boosting (e.g., rising above VBAT) of the output voltage at the output port 216 of the boost converter 210.

In some embodiments, the boost converter 210 is a converter circuit of an integrated circuit. In some embodiments, the boost converter 210 is a boost converter circuit of the integrated circuit. In some embodiments, the converter circuit is powered by a power source (e.g., 120 of FIG. 1) and provides an output voltage (VBST_OUT), greater than the voltage of the power source, at the output port VBST_OUT, while controlling a current and a time. In some embodiments, the current is an inrush current, and the time is a startup time of the boost converter 210. In some embodiments, the first startup stage of the boost converter 210 includes multiple phases.

An implementation detail of a portion of the boost converter 210, including the isolation switch 220, is depicted by the diagram 200B in FIG. 2B. In some embodiments, boost converter 210 is converter circuit. In some embodiments, the full description of the diagram 200B is not within the scope of the current disclosure, however, blocks 222, 224, and 226 are related to some functionalities of the subject technology. For example, the isolation switch 220 is shown as a p-type metal-oxide semiconductor (PMOS) M0. In some embodiments, the converter circuit includes a passive circuit that is configurable to bypass the isolation switch 220, disposed between a power source terminal 202 and a first terminal (e.g., input port 212) of the inductor LIN during a first phase of a first startup stage of the converter circuit. In some embodiments, the passive circuit includes the block 222 consisting of a switch Ms1 and a resistor Rs1, which provides a passive charging of the boost inductor LIN with the fixed RS1 by closing the switch Ms1 during a first phase of the first startup stage.

In some embodiments, the boost converter 210 includes circuitry to control an inrush current and a startup time. In some embodiments, the circuitry performs a first startup stage in multiple phases and during a second startup stage vary a duty cycle of a pulse controlling one or more switches of the boost converter 210.

In some embodiments, the converter circuit includes a closed-loop circuit (e.g., block 226), which operates as a current source and facilitates constant-current charging of the output port during a second phase of the first startup stage. In some embodiments, the converter circuit is configured to control the in rush current and the startup time at least partially during the first startup stage. In some embodiments, the converter circuit further comprises a resistor circuit including the block 224, which can be configured to turn on the isolation switch 220 during a third phase of the first startup stage to reduce an inherent resistance of the isolation switch. The resistor circuit turns on the isolation switch 220 by providing a suitable bias voltage (VG) to the gate terminal of the isolation switch 220, which is depicted as MO in FIG. 2B. In some embodiments, the converter circuit further includes a PWM circuit (not shown for simplicity), which can generate pulses with varying duty cycles that drives the LS in the boost converter 210 to maintain a charging speed while keeping the level of the inrush current below a desired value during a second startup stage of the converter circuit. In some embodiments, a processor (not shown for simplicity) varies the duty cycle of the pulse from an initial value (first value) within a range of 5% to 10% and a final value (second value) within a range of 50% to 60%. In some embodiments, the desired value of the inrush current is within a range of 90-110 mA. The pulses generated by the PWM circuit are applied to gates of the LS and HS switches.

In some embodiments, the boost converter 210 receives control signals from a closed-loop regulation circuit (e.g., in FIG. 4 below) to provide an output voltage at the output port 216 of the boost converter 210 during the third startup stage.

Figure 3:
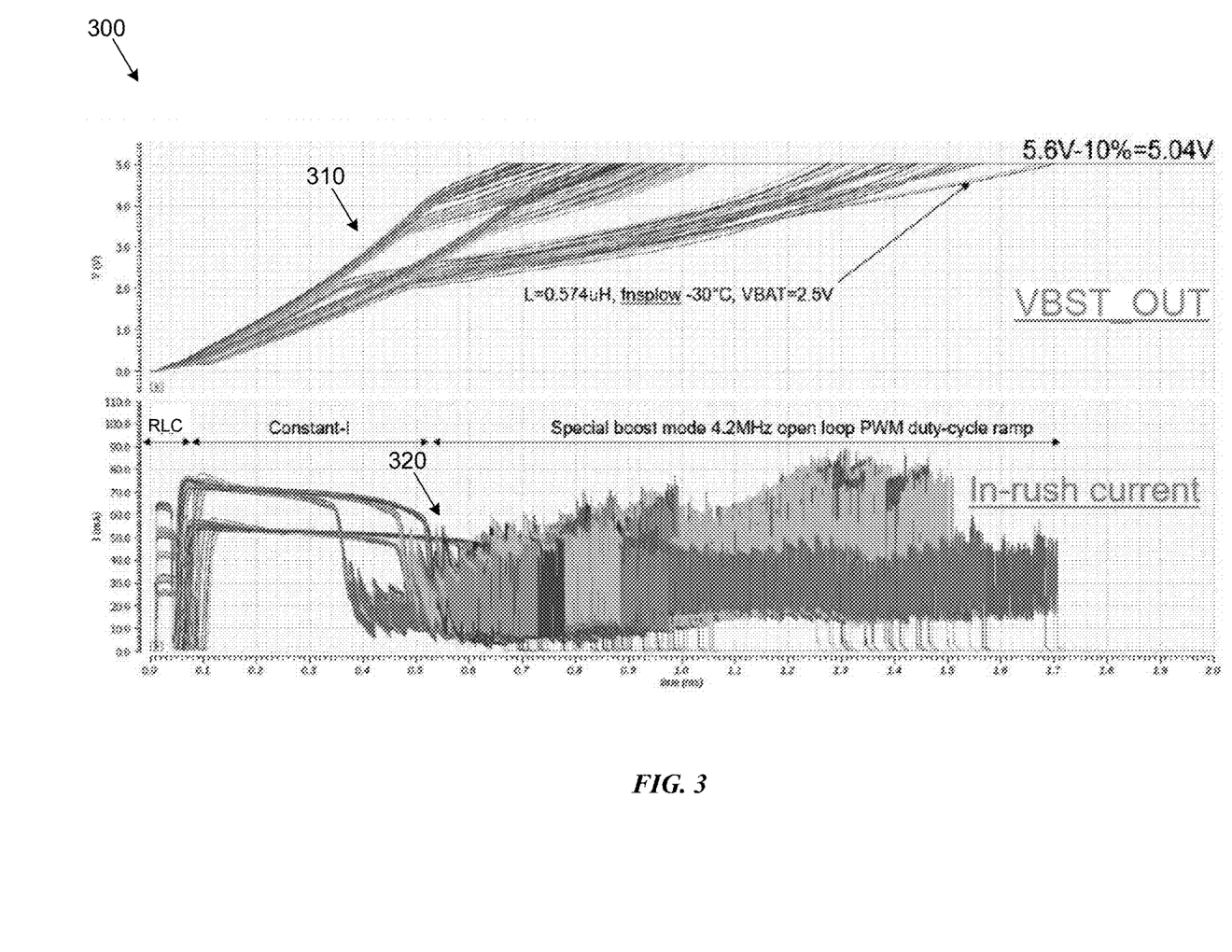
FIG. 3 is a chart illustrating example time variations of an output voltage and inrush current of a SMPS, according to aspects of the subject technology.

FIG. 3 is a chart 300 illustrating example time variations of an output voltage and inrush current of a SMPS, according to aspects of the subject technology. The chart 300 includes a set of plots 310 and a set of plots 320. The set of plots 310 depict example time variations of the output voltage (in volts) of the boost converter (e.g., boost converter 210 of FIG. 2) of the subject technology for a power source voltages (VBAT) of about 2.5 V, 3.85 V and 4.55 V and an inductance values of 0.47±20% microhenries (µH) of the boost inductor. Different plots of the set of plots 310 correspond to different process, voltage, and temperature corners in the simulation, and each plot contains the three stages described above. As is shown in set of plots 310, the startup time is less than about 2.7 microseconds (µs), which is reduced from the values for the existing approaches, and the output voltage reaches a specified value of about 5.04 V, which is above the voltage of the power source (VBAT).

The set of plots 320 depict example time variations of the inrush current (in mA) of the boost converter (e.g., 210 of FIG. 2) of the subject technology on the same time axis as the set of plots 310. Just as in the set of plots 310, different plots of the set of plots 320 correspond to different process, voltage, and temperature corners. The variations of the inrush currents during the multiple phases of the first startup stage of the example boost converter including a first phase of stage 1 (RLC phase), the second phase (constant-I) phase of stage 1, and a brief third phase (not shown) of stage 1 where the isolation switch fully turns on, followed by stage 2 (boost phase with PWM duty-cycle ramp) are seen to be limited to less than 100 mA.

Figure 4:
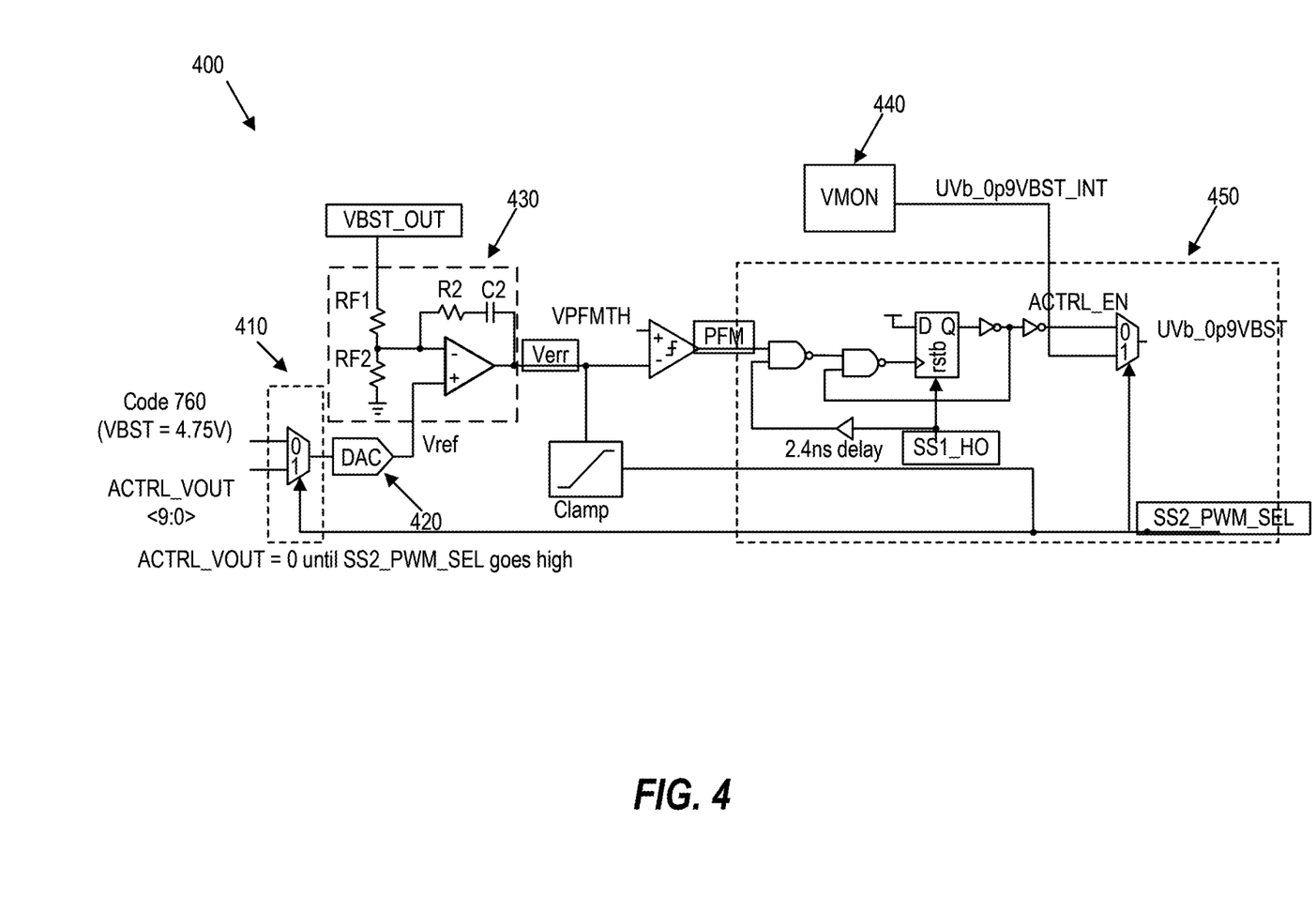
FIG. 4 is a schematic diagram illustrating an example closed-loop regulation stage, according to aspects of the subject technology.

FIG. 4 is a schematic diagram illustrating an example of a closed-loop regulation stage 400, according to aspects of the subject technology. The closed-loop regulation stage 400 is responsible for the third startup stage of the boost converter (e.g., 220 of FIG. 2). The closed-loop regulation stage 400 includes, but is not limited to, an input comparator block 410, a DAC 420, a comparator circuit 430, a voltage monitor (VMON) 440, and a logic circuit 450. The input comparator block 410 compares an active control (ACTRL_VOUT) input, which is a 10 bit code for 4.7 V with a preset boost converter output (VBST=4.75 V) and sends its output to the DAC 420 to be converted to an analog signal Vref. The ACTRL_VOUT is 0 until SS2_PWM_SEL signal transition to high (H). The comparator circuit 430 compares VBST_OUT with the Vref signal and the result is a Verr signal. When the boost stage is complete, the VBST_OUT is greater than a preset value (VBST=4.75 V), Verr signal transitions from H to low (L), and consequently the pulse-frequency modulation (PFM) signal transitions from L to H. This causes the logic circuit to change the ACTRL_EN signal to transition from L to H, which results is a smooth transition to the closed-loop regulation. With the set point being less than the preset value (VBST=4.75 V), the boost converter stops switching so that no inrush current would be produced.

In some embodiments, for a warm power-up where boost converter output voltage (VBST_OUT) is present, a state machine (not shown for simplicity) recognizes completion of the first startup stage and the second startup stage to allow a smooth transition to the third startup stage, which is the closed-loop regulation stage, in response to the output voltage being greater that a preset voltage. In some embodiments, the completion of the first startup stage and the second startup stage is recognized by the state machine, which, for example, monitors the Verr signal transitioning from H to L, the PFM signal transitioning from L to H and/or transitioning of the ACTRL_EN signal from L to H. In some embodiments, the boost converter includes a circuit that can cause a smooth transition to a third startup stage, as seen from the plots 310 of the output voltage, with a near-zero (e.g., less than 100 mA) inrush current.

In some embodiments, the converter circuit includes the closed-loop regulation stage 400 that, as discussed above, provides an output voltage at the output port of the converter circuit during the third startup stage.

Figures 5A, 5B, 5C:
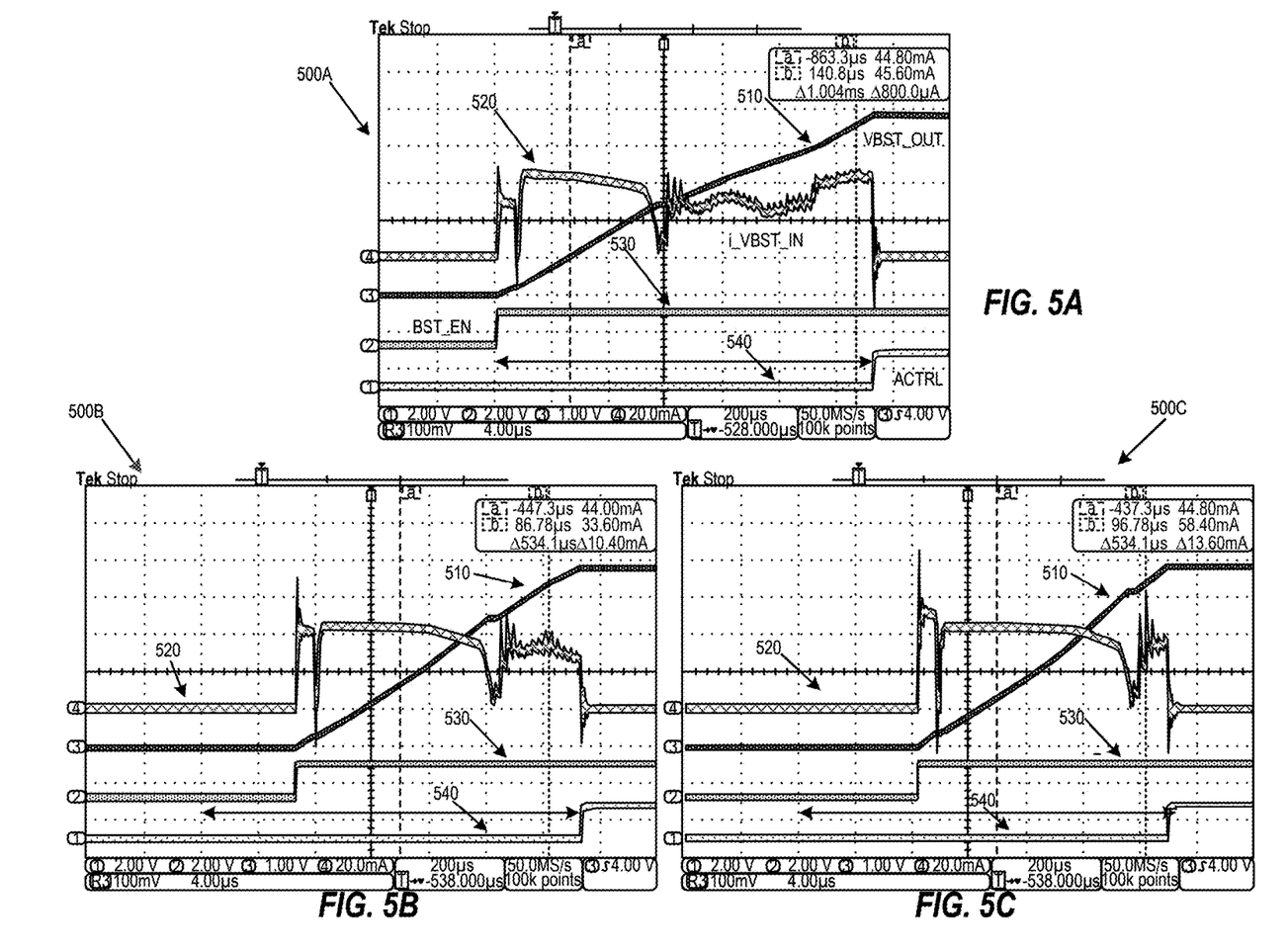
FIGS. 5A, 5B, and 5C are charts illustrating examples of time variations of an output voltage, a current, and enable signals of an SMPS, according to aspects of the subject technology.

FIGS. 5A, 5B, and 5C are charts 500A, 500B, and 500C, respectively, illustrating examples of time variations of an output voltage, a current, and enable signals of an SMPS, according to aspects of the subject technology. The charts 500A, 500B, and 500C correspond to different boost converter input (VBST_IN) values. The chart 500A corresponds to a low boost converter input (VBST_IN) value of 2.8V. The chart 500B corresponds to a typical boost converter input (VBST_IN) value of 3.85V. The chart 500A includes plots 510, 520, 530, and 540, which respectively depict time variations of a boost converter output voltage (VBST_OUT), boost converter input current (i_VBST_IN), a boost converter enables (BST_EN) signal, and an active-control enable (ACTRL_EN) signal. The time duration between the rising edge of the BST_EN signal (i.e., plot 530) and the rising edge of the ACTRL_EN signal (i.e., plot 540) is the startup time or power-up time of the boost converter. The chart 500B corresponds to a typical boost converter input (VBST_IN) value of 3.85 V and is similar to the chart 500A. The charts 500C corresponds to a high boost converter input (VBST_IN) value of 4.55V and is also similar to the chart 500A.

As shown in the charts 500A, 500B, and 500C, the inrush current is maintained relatively constant for quickest startup while keeping it below the specified inrush current limit. As seen from variations of the plots 510 of the boost converter output voltage (VBST_OUT), the entire startup appears to be quite smooth, which is an important feature of the subject technology.

Figure 6:
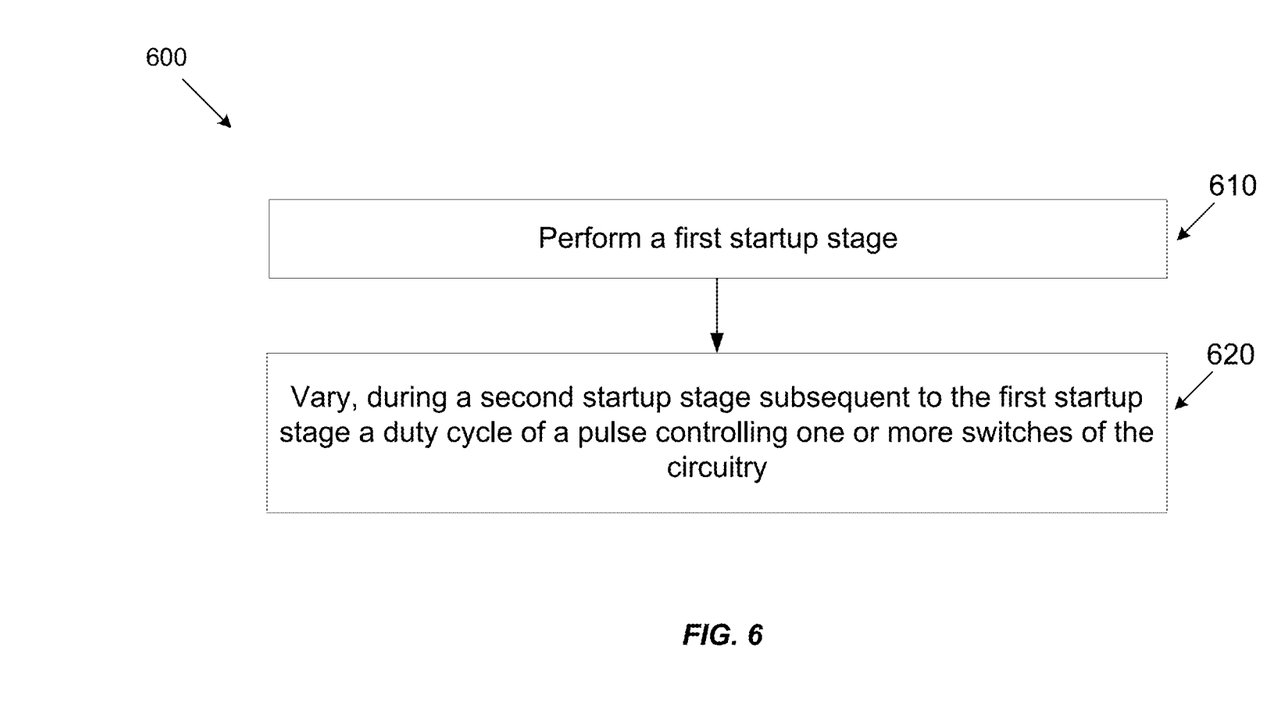
FIG. 6 is a flow diagram illustrating an example of a process for a SMPS startup, according to aspects of the subject technology.

FIG. 6 is a flow diagram illustrating an example of a process 600 for an SMPS startup, according to aspects of the subject technology. The process 600 is implemented by a circuit (e.g., boost converter 210 of FIG. 2A) configured to be powered by a power source (e.g., VBAT provided at the power source terminal 202 of FIG. 2A). The circuit performs a first startup stage (610). The circuit varies, during a second startup stage subsequent to the first stage, a duty cycle of a pulse controlling one or more switches of the circuitry (620).

Figure 7:
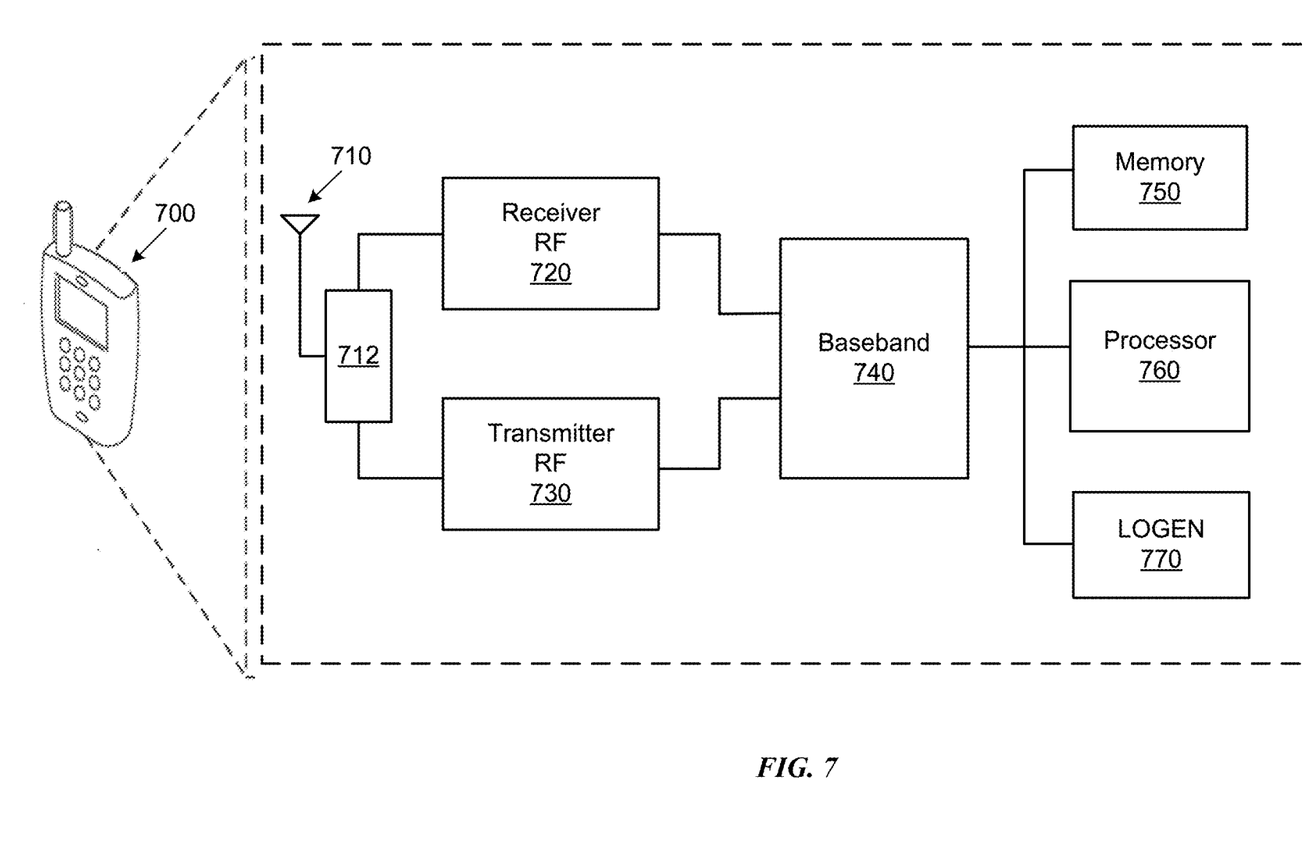
FIG. 7 illustrates an example of a wireless communication device within which some aspects of the subject technology are implemented.

FIG. 7 illustrates an example of a wireless communication device 700 within which some aspects of the subject technology are implemented. In one or more implementations, the wireless communication device 700 can be a tablet, a smartphone, a smartwatch, or other electronic device that includes a pressure sensor. The wireless communication device 700 may comprise an RF antenna 710, a duplexer 712, a receiver 720, a transmitter 730, a baseband processing module 740, a memory 750, a processor 760 and a local oscillator generator (LOGEN) 770. In various aspects of the subject technology, one or more of the blocks represented in FIG. 7 may be integrated on one or more semiconductor substrates. For example, blocks 720-770 may be realized in a single chip, a single system on a chip, or in a multichip chipset.

The receiver 720 may comprise suitable logic circuitry and/or code that may be operable to receive and process signals from the RF antenna 710. The receiver 720 may, for example, be operable to amplify and/or down convert received wireless signals. In various aspects of the subject technology, the receiver 720 may be operable to cancel noise in received signals and may be linear over a wide range of frequencies. In this manner, the receiver 720 may be suitable for receiving signals in accordance with a variety of wireless standards such as Wi-Fi, WiMAX, BT, and various cellular standards. In various aspects of the subject technology, the receiver 720 may not use any sawtooth acoustic wave filters, and few or no off-chip discrete components such as large capacitors and inductors.

The transmitter 730 may comprise suitable logic circuitry and/or code that may be operable to process and transmit signals from the RF antenna 710. The transmitter 730 may, for example, be operable to upconvert baseband signals to RF signals and amplify RF signals. In various aspects of the subject technology, the transmitter 730 may be operable to upconvert and amplify baseband signals processed in accordance with a variety of wireless standards. Examples of such standards may include Wi-Fi, WiMAX, BT, and various cellular standards. In various aspects of the subject technology, the transmitter 730 may be operable to provide signals for further amplification by one or more power amplifiers.

In some implementations, all active components of the wireless communication device 700, for example, the receiver 720, the transmitter 730, the baseband processing module 740, the memory 750, the processor 760 and the LOGEN 770 may receive power from a power supply including an SMPS (e.g., 100 of FIG. 1) of the subject technology and benefit from the controlled inrush current and the startup time of the SMPS of the subject technology.

The duplexer 712 may provide isolation in the transmit band to avoid saturation of the receiver 720 or damaging parts of the receiver 720, and to relax one or more design requirements of the receiver 720. Furthermore, the duplexer 712 may attenuate the noise in the receive band. The duplexer 712 may be operable in multiple frequency bands of various wireless standards.

The baseband processing module 740 may comprise suitable logic, circuitry, interfaces, and/or code that may be operable to perform the processing of baseband signals. The baseband processing module 740 may, for example, analyze received signals, and generate control, and/or feedback signals for configuring various components of the wireless communication device 700, such as the receiver 720. The baseband processing module 740 may be operable to encode, decode, transcode, modulate, demodulate, encrypt, decrypt, scramble, descramble, and/or otherwise process data in accordance with one or more wireless standards.

The processor 760 may comprise suitable logic, circuitry, and/or code that may enable processing data and/or controlling operations of the wireless communication device 700. In this regard, the processor 760 may be enabled to provide control signals to various other portions of the wireless communication device 700. The processor 760 may also control the transfer of data between various portions of the wireless communication device 700. Additionally, the processor 760 may enable implementation of an OS or otherwise execute code to manage operations of the wireless communication device 700.

The memory 750 may comprise suitable logic, circuitry, and/or code that may enable storage of various types of information such as received data, generated data, code, and/or configuration information. The memory 750 may comprise, for example, RAM, ROM, flash, and/or magnetic storage. In various aspects of the subject technology, information stored in the memory 750 may be utilized for configuring the receiver 720 and/or the baseband processing module 740.

The LOGEN 770 may comprise suitable logic, circuitry, interfaces, and/or code that may be operable to generate one or more oscillating signals of one or more frequencies. The LOGEN 770 may be operable to generate digital and/or analog signals. In this manner, the LOGEN 770 may be operable to generate one or more clock signals, and/or sinusoidal signals. Characteristics of the oscillating signals such as the frequency and duty cycle may be determined based on one or more control signals from, for example, the processor 760 and/or the baseband processing module 740.

In operation, the processor 760 may configure the various components of the wireless communication device 700 based on a wireless standard according to which it is designed to receive signals. Wireless signals may be received via the RF antenna 710, then amplified and down converted by the receiver 720. The baseband processing module 740 may perform noise estimation and/or noise cancellation, decoding, and/or demodulation of the baseband signals. In this manner, information in the received signal may be recovered and utilized appropriately. For example, the information may be audio and/or video to be presented to a user of the wireless communication device 700, data to be stored to the memory 750, and/or information affecting, and/or enabling operation of the wireless communication device 700. The baseband processing module 740 may modulate, encode, and perform other processing on audio, video, and/or control signals to be transmitted by the transmitter 730 in accordance with various wireless standards.

The predicate words "configured to", "operable to", and "programmed to" do not imply any particular tangible or intangible modification of a subject, but rather are intended to be used interchangeably. For example, a processor configured to monitor and control an operation or a component may also mean the processor is being programmed to monitor and control the operation or the processor being operable to monitor and control the operation. Likewise, a processor configured to execute code can be construed as a processor programmed to execute code or operable to execute code.

A phrase such as an "aspect" does not imply that such aspect is essential to the subject technology, or that such aspect applies to all configurations of the subject technology. A disclosure relating to an aspect may apply to all configurations, or one or more configurations. A phrase such as an "aspect" may refer to one or more aspects, and vice versa. A phrase such as a "configuration" does not imply that such configuration is essential to the subject technology, or that such configuration applies to all configurations of the subject technology. A disclosure relating to a configuration may apply to all configurations, or one or more configurations. A phrase such as a "configuration" may refer to one or more configurations, and vice versa.

The word "example" is used herein to mean "serving as an example or illustration." Any aspect or design described herein as "example" is not necessarily to be construed as preferred or advantageous over other aspects or designs.

All structural and functional equivalents to the elements of the various aspects described throughout this disclosure that are known, or later come to be known to those of ordinary skill in the art, are expressly incorporated herein by reference and are intended to be encompassed by the claims. Moreover, nothing disclosed herein is intended to be dedicated to the public, regardless of whether such disclosure is explicitly recited in the claims. No claim element is to be construed under the provisions of 35 U.S.C. § 112(f) unless the element is expressly recited using the phrase "means for" or, in the case of a method claim, the element is recited using the phrase "step for." Furthermore, to the extent that the term "include," "have," or the like is used in the description or the claims, such term is intended to be inclusive in a manner similar to the term "comprise", as "comprise" is interpreted when employed as a transitional word in a claim.

Those of skill in the art would appreciate that the various illustrative blocks, modules, elements, components, methods, and algorithms described herein may be implemented as electronic hardware, computer software, or combinations of both. To illustrate this interchangeability of hardware and software, various illustrative blocks, modules, elements, components, methods, and algorithms have been described above generally in terms of their functionality. Whether such functionality is implemented as hardware or software depends upon the particular application and design constraints imposed on the overall system. Skilled artisans may implement the described functionality in varying ways for each particular application. Various components and blocks may be arranged differently (e.g., arranged in a different order, or partitioned in a different way), all without departing from the scope of the subject technology.

What is claimed is:

1. An apparatus, comprising:
   circuitry configured to:
      perform a first startup stage including a constant-current charging phase, wherein during the constant-current phase, the circuitry is configured to facilitate constant-current charging at an output port using a closed-loop regulation and provide an output voltage of the circuitry at the output port, and
      vary, during a second startup stage subsequent to the first startup stage, a duty cycle of a pulse controlling one or more switches of the circuitry.

2. The apparatus of claim 1, wherein the circuitry is configured to control an inrush current and a startup time of the circuit.

3. The apparatus of claim 2, wherein the circuitry is configured to control the inrush current to less than 100 mA.

4. The apparatus of claim 1, wherein:
   the circuitry comprises passive elements and an isolation switch,
   the first startup stage comprises a first phase, and
   during the first phase, the passive elements bypass the isolation switch and provide a path for the output voltage of the circuitry.

5. The apparatus of claim 4, wherein:
   the circuitry further comprises a resistor circuit and an inductor, and
   the first startup stage further comprises a third phase, and
   during the third phase, the resistor circuit is configured to fully turn on the isolation switch to reduce an inherent resistance of the isolation switch.

6. The apparatus of claim 1, wherein during the second startup stage, the circuitry is configured to vary the duty cycle of the pulse from a first value to a second value.

7. The apparatus of claim 6, wherein the first value is within a range of 5% to 10% and the second value is within a range of 50% to 60%.

8. The apparatus of claim 1, wherein the circuitry is further configured to:
   transition from the second startup stage to a third startup stage in response to the output voltage being greater than a preset voltage.

9. The apparatus of claim 8, wherein during the third startup stage, the circuitry is further configured to provide the output voltage.

10. The apparatus of claim 1, wherein:
    the circuitry further comprises:
       a first switch,
       a second switch,
       a switching node, and
       a ground potential,
       wherein:
          the first switch is configured to couple the switching node to the ground potential, and
          the second switch is configured to couple the switching node to the output port.

11. An integrated circuit, comprising:
    circuitry configured to be powered by a power source, the circuitry comprising:
       an inductor, and
       an isolation switch that is disposed between the power source and the inductor, wherein:
          during a first phase of a first startup stage of the circuitry, the circuitry is further configured to bypass the isolation switch, and
          during a second phase of the first startup stage, the circuitry is further configured to facilitate constant-current charging for an output voltage of the circuitry using a closed-loop regulation.

12. The integrated circuit of claim 11, wherein the circuitry is further configured to control an inrush current and a startup time of the circuitry.

13. The integrated circuit of claim 12, wherein:
    the circuitry is further configured to control the inrush current and the startup time at least partially during the first startup stage.

14. The integrated circuit of claim 12, wherein:
during a second startup stage of the circuitry, the circuitry is further configured to generate pulses with varying duty cycles to maintain charging speed while keeping the inrush current below a value, and
the value is within a range of 90-110 mA.

15. The integrated circuit of claim 14, further comprising a state machine configured to:
determine completion of the first startup stage and the second startup stage, and
allow a transition to a third startup stage of the circuitry, wherein during the third startup stage, the circuitry is further configured to provide the output voltage.

16. The integrated circuit of claim 11, wherein the circuitry further comprises:
a first switch configured to couple the inductor to a ground potential of the circuitry; and
a second switch configured to couple the inductor to an output port of the circuit, wherein the output port is configured to receive the output voltage.

17. A communication device comprising:
circuitry comprising one or more switches, the circuitry configured to:
control an inrush current and a startup time,
perform a first startup stage in multiple phases including a constant-current charging phase, wherein during the constant-current phase, the circuitry is configured to facilitate constant-current charging at an output port using a closed-loop regulation and provide an output voltage of the circuitry at the output port, and
vary, during a second startup stage subsequent to the first startup stage, a duty cycle of a pulse that controls the one or more switches.

18. The communication device of claim 17, wherein the circuitry is configured to:
perform the first startup stage that includes:
a first phase,
a second phase subsequent to the first phase, wherein the second phase is the constant-current charging phase, and
a third phase subsequent to the second phase; and
perform the second startup stage subsequent to the first startup stage.

19. The communication device of claim 18, wherein the circuitry is configured to vary the duty cycle of the pulse from an initial value within a range of 5% to 10% and a final value within a range of 50% to 60%.

* * * * *